US008574821B1

(12) United States Patent  (10) Patent No.: US 8,574,821 B1
Ostrow, II et al.  (45) Date of Patent: Nov. 5, 2013

(54) MEMS FABRICATION PROCESS BASE ON SU-8 MASKING LAYERS

(75) Inventors: Scott A Ostrow, II, Corvallis, OR (US); Ronald A Coutu, Jr., Xenia, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 13/333,169

(22) Filed: Dec. 21, 2011

(51) Int. Cl.
    *G03F 7/20* (2006.01)
(52) U.S. Cl.
    USPC ............................................. 430/319
(58) Field of Classification Search
    USPC .................................. 430/311, 313, 318, 319
    See application file for complete search history.

(56) References Cited

PUBLICATIONS

Charles Chung and Mark Allen, Uncrosslinked SU-8 as a sacrificial material, Journal of Micromechanics and Microengineering, Sep. 23, 2004,pp. N1-N5.
C.K. Chung, C.J. Lin, L.H. Wu, Y.J. Fang, Y.Z. Hong, Selection of mold materials for electroforming of monolithic two-layer microstructure, Microsystem Technologies, pp. 467-471.
F.G. Tseng, Y.J. Chuang, W.K. Lin, A novel fabrication method of embedded micro channels employing simple uv dosage control and antireflection coating, Engineering and System Science Dept, pp. 69-72.
Daniel Haefliger and Anja Boisen, Three-dimensional microfabrication in negative resist using printed masks, Journal of Micromechanics and Microengineering, Mar. 30, 2006, pp. 951-957.
Bej Alderman, CM Mann, DP Steenson and JM Chamberlain, Microfabrication of channels using an embedded mask in negative resist, Journal of Micromechanics and Microengineering, Oct. 12, 2001, pp. 703-705.
Victor Manuel Blanco Carballo, Maximilien Chefdeville, Martin Fransen, Harry Van Der Graaf, Joost Melai, Cora Salm, Jurriaan Schmitz, Jan Timmermans, A radiation imaging detector made by postprocessing a standard CMOS chip, IEEE electron device letters, Jun. 8, vol. 29, No. 6, pp. 585-587.
Frederik Ceyssens and Robert Puers, Creating multi-layered structures with freestanding parts in SU-8, Journal of Micromechanics and Microengineering, May 8, 2006, pp. S19-S23.
Patrick Abgrall, Christine Lattes, Veronique Conedera, Xaiver Dollat, Stephane Colin, Anne Marie Gue, A novel fabrication method of flexible and monolithic 3D microfluidic structures using lamination of SU-8 films, Dec. 12, 2005, pp. 113-121.

*Primary Examiner* — Brittany Raymond
(74) *Attorney, Agent, or Firm* — AFMCLO/JAZ; Fredric Sinder

(57) ABSTRACT

A novel fabrication process uses a combination of negative and positive photoresists with positive tone photomasks, resulting in masking layers suitable for bulk micromachining high-aspect ratio microelectromechanical systems (MEMS) devices. This technique allows the use of positive photomasks with negative resists, opening the door to an ability to create complementary mechanical structures without the fabrication delays and costs associated with having to obtain a negative photomask. In addition, whereas an SU-8 mask would normally be left in place after processing, a technique utilizing a positive photoresist as a release layer has been developed so that the SU-8 masking material can be removed post-etching.

18 Claims, 8 Drawing Sheets

MEMS FABRICATION PROCESS BASE ON SU-8 MASKING LAYERS

RIGHTS OF THE GOVERNMENT

The invention described herein may be manufactured and used by or for the Government of the United States for all governmental purposes without the payment of any royalty.

BACKGROUND OF THE INVENTION

The invention relates to microelectromechanical systems and microfabrication.

Photolithography is an iterative process used to transfer patterns from a photomask design onto a photosensitive material or photoresist. Once transferred into the photoresist, the pattern is then developed and "windows" to the underlying material are opened up. The underlying materials are then etched away, leaving behind a permanent pattern in the lower material, or materials are deposited into the windows. When fabricating surface micromachined microelectromechanical systems (MEMS) devices, thin film depositions are interlaced with photolithography, etching, and lift-off processing steps. Typically, positive photomasks and photoresists are used in MEMS fabrication to ensure fine resolution and precise minimum feature sizes. Sometimes, however, reverse field or complementary mechanical structures must be etched into the substrate (e.g., thermal isolation), which necessitates using a combination of surface and bulk micromachining and involving aggressive etch chemistries, negative photoresist, and robust masking materials. When these situations arise, the ability to use a positive photomask with a negative resist is often helpful to avoid fabrication delays and higher costs. In addition, certain negative photoresists (i.e., MicroChem's Nano™ SU-8) are desirable because when they are hard baked they become chemically and thermally resistant. This allows them to stand up very well to the aggressive etching profiles needed for bulk micromachining, such as $SF_6$, when isotropic silicon etching is required.

AZ 5214E is a positive photoresist that also has the ability to be utilized for image reversal, providing the negative pattern of a photomask. It is most commonly utilized in the IR mode for lift-off processes where thin film metals are deposited and selectively patterned using a lift-off technique. Through an initial exposure, post-exposure bake (which acts as an image reversal bake), and flood exposure steps, image reversal is easily obtained. After a layer of AZ 5214E is exposed with a positive photomask, it is baked at a temperature between 115° C. and 125° C., which initiates an agent in the photoresist that crosslinks the areas that have been exposed. This step is critical, since if it is not baked at the right temperature (±1° C.) the negative pattern of the photomask will not be obtained and the AZ 5214E will just act like a positive photoresist. Therefore, it is important to determine and optimize the reversal bake temperature in the range mentioned above for individual processes. The exposure of a photoactive compound within the photoresist, and the crosslinking in the exposed areas, makes these exposed areas insoluble in the developer. Meanwhile, after a flood exposure, the unexposed areas develop away in a standard positive photoresist developer. Unfortunately, AZ 5214E alone is not robust enough to stand up to the aggressive bulk micromachining etching profiles.

SU-8 is a thick, epoxy-based, high contrast photoresist that is typically used in applications where it will be a permanent layer. Through an exposure and post-exposure bake steps, an SU-8 layer crosslinks and becomes resistant to liquid developers, and a wide range of other removal methods [e.g., $O_2$ plasma ashing, reactive ion etching (RIE), corrosive etches, etc.], thus making SU-8 an excellent masking material for bulk micromachining. The exposure step creates an acid and the post-exposure bake step follows this up by thermally activating the acid to crosslink the exposed areas. The challenge here is that the SU-8 must remain uncrosslinked, and therefore unexposed, through a majority of the process. If the SU-8 gets exposed at any point it will crosslink and no longer be usable for this process. Various methods have been used to protect an uncrosslinked SU-8 layer during subsequent lithography and/or metal deposition steps, such as a filament evaporated metal layer, using an antireflective coating on top of the SU-8, UV exposure dose control, contact printing of a metal layer, and using a positive photoresist as a protection layer. These approaches have been used in applications where SU-8 is utilized as a sacrificial material, in the creation of microfluidic channels and other stacked structures, and for electroforming.

SUMMARY OF THE INVENTION

A novel processing technique has been developed that uses a combination of negative and positive photoresists for use with positive photomasks, resulting in masking layers suitable for bulk micromachining in the fabrication of microelectromechanical systems (MEMS). This technique allows for the use of positive photomasks with negative resists, which opens the door to the ability to create complementary mechanical structures without the fabrication delays and cost associated with having to obtain a negative photomask. This is a novel processing technique, which can realize savings in both money (in terms of the thousands of dollars that would have been spent on a negative photomask), and time (in terms of the time that would have been needed to design, order, and receive a negative photomask).

In order to protect the unexposed SU-8 in the processing technique presented here, a protective layer of positive photoresist is utilized on top of the SU-8 to protect it from being exposed and crosslinked during the evaporation of the metal barrier layer. This metal layer then serves to protect the unexposed SU-8 from being inadvertently exposed and crosslinked during subsequent UV photolithography steps performed on the AZ 5214E photoresist layer.

The present invention utilizes image reversal (IR) and a positive tone mask to achieve the intended results described above. Of course, one could purchase a new mask if funding were available. Often times, however, in university-based, sponsor-funded research, funding is simply not available to purchase new masks while device fabrication is on-going. With the present invention, the fabrication schedule can be preserved and research dollars saved. For example, a new negative tone mask with 2 µm minimum features can cost approximately $3500 per mask and takes approximately 1 week to write, fabricate, and ship. This unnecessary delay and cost can add up quickly when device fabrication-oriented research is being conducted. The innovative procedure developed here utilizes photolithography chemicals, equipment, and processes that are readily available in most university fabrication facilities. Specifically, SU-8 and Clariant's image reversal photoresist AZ 5214E are used, along with a barrier layer composed of a protective positive photoresist layer (Rohm and Haas Microposit™ S1818) and an evaporated metal layer, to effectively convert a positive photomask into a negative photomask. The overall process resolution is limited by the SU-8 negative photoresist since AZ 5214E allows for feature resolutions below 0.5 µm and SU-8's resolution limit is approximately 2 μm. Nevertheless, the novel fabrication process presented here is straightforward and suitable for novice device fabricators making bulk micromachined structures.

A novel processing technique that uses a combination of negative and positive photoresists with positive tone masks, resulting in reversed masking layers suitable for bulk micromachining, has been developed. This process has been demonstrated through the fabrication of trenches in a silicon substrate, utilizing a positive photomask along with a combination of AZ 5214E image reversal photoresist, a barrier layer of an S1818 protective layer and evaporated metal layer, and SU-8 negative photoresist. Titanium, aluminum, and gold were shown to be effective UV barrier layer metals. This novel procedure is actually quite simple and suitable for even novice device fabricators. Despite being simple and straightforward in concept, there are critical pitfalls that must be considered and effectively avoided when working through this process. These include, but are not limited to, thermal concerns with the SU-8 layer to ensure it does not hard bake, negative and unforeseen interactions between the SU-8 layer and other material layers, and ensuring that the uncrosslinked SU-8 does not get exposed and crosslinked prematurely. Finally, a simple process for removing unwanted robust layers of SU-8 (post-etch) was developed where S1818 was used as releasable layer deposited underneath the SU-8. As a final note, while the materials mentioned (SU-8 for negative photoresist, S1818 for positive photoresist, AZ 5214E for image reversal photoresist) are the preferred embodiments, the present invention is not limited to these materials.

DETAILED DESCRIPTION

This processing technique has been detailed in: (1) Scott A. Ostrow II, Jack P. Lombardi III and Ronald A. Coutu, Jr., "Using positive photomasks to pattern SU-8 masking layers for fabricating inverse MEMS structures", Proc. SPIE 7972, 79722J (2011); doi:10.1117/12.881653; and, (2) Scott A. Ostrow and Jr. Ronald A. Coutu, "Novel microelectromechanical systems image reversal fabrication process based on robust SU-8 masking layers", J. Micro/Nanolith. MEMS MOEMS 10, 033016 (Sep. 2, 2011); doi:10.1117/1.3625633, both of which are incorporated herein by reference.

Figure 1:
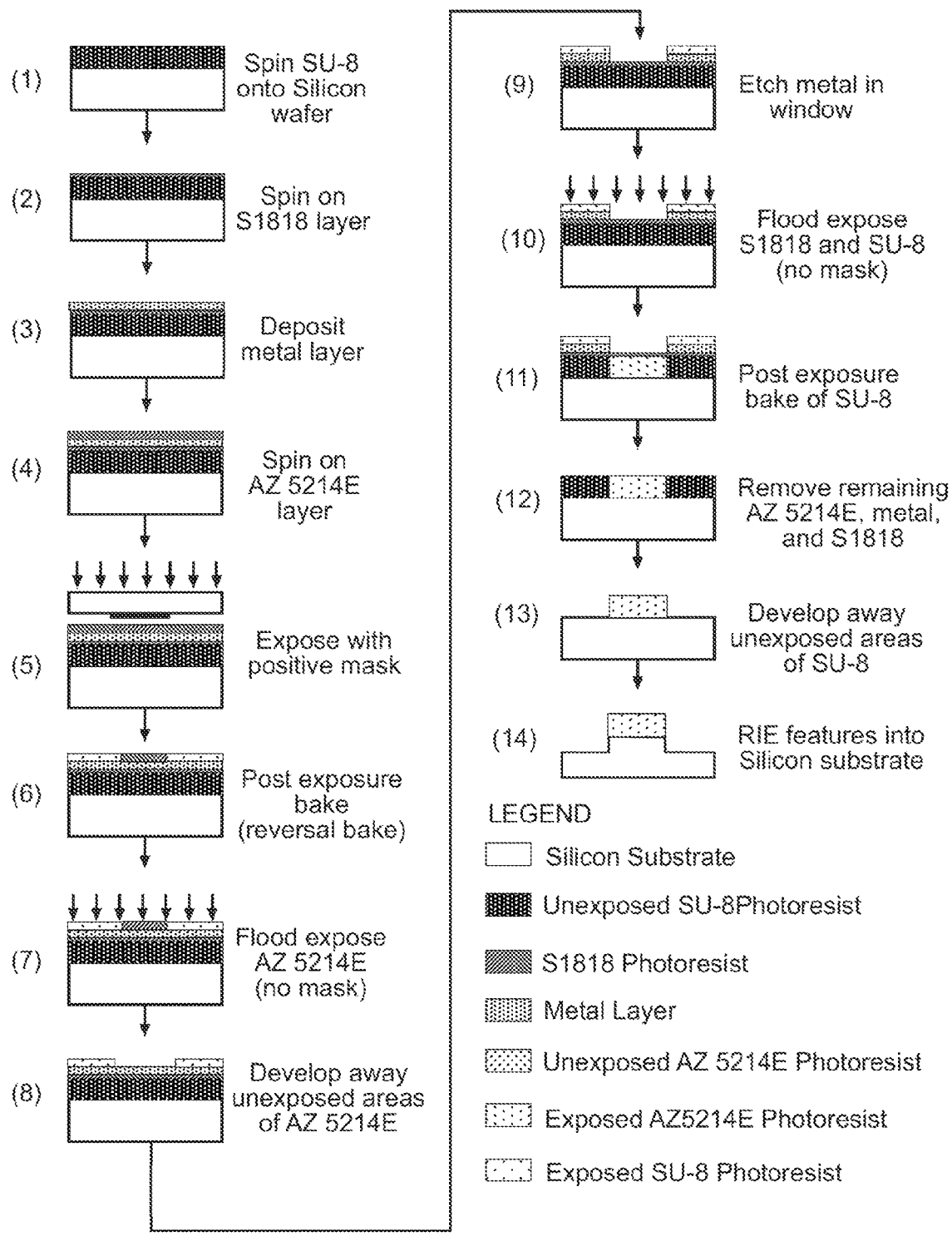
FIG. 1 is the process flow for using positive photomasks to pattern SU-8 masking layers for fabricating inverse MEMS structures.
Figure 2:
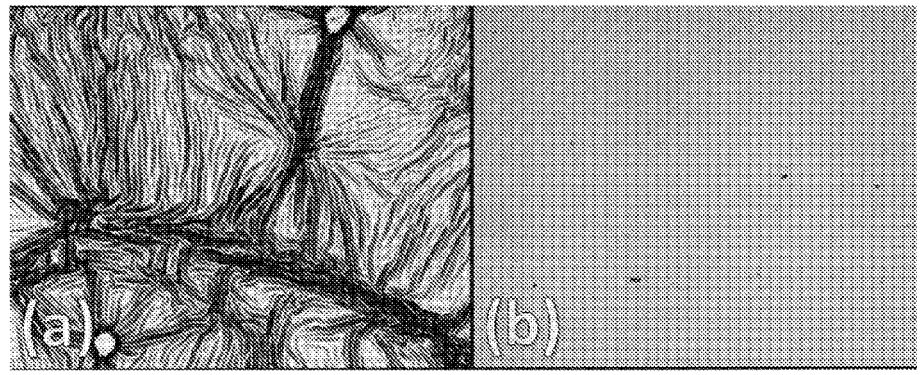
FIG. 2 is the qualitative difference in integrity of an aluminum barrier layer based on S1818 softbake time. (a) Standard 75 sec., shows deformations in the metal layer as a result of solvents baking out from the S1818 layer below it, (b) 12.5 min, shows a more uniform metal layer since the solvents were completely baked out prior to metal deposition.

The process starts with the coating of a clean silicon wafer with SU-8 at the standard spin speeds. A 5-μm thick SU-8 layer was utilized in the development of this novel process. This is followed by a ramped softbake, with a bake at 65° C. for 3 min. followed by a bake at 110° C. for 10 min. This is a longer bake time and higher bake temperature than typically prescribed, but it is critical to ensure the integrity of the SU-8 layer and to optimize material compatibility throughout subsequent processing. After a rest of several minutes at ambient temperature to allow for the SU-8 layer to stabilize, the wafer sample is coated with a buffer layer of S1818 positive photoresist, which serves to protect the SU-8 from being exposed and crosslinked during metal deposition. Allowing the SU-8 layer to stabilize creates a solid base for the S1818 layer, and reduces the chances of unwanted interactions between the two photoresists. The SU-8 layer needs to be protected because it is highly sensitive to UV wavelengths, and high energy photon radiation emitted during the deposition process are in this range and above, thus resulting in the exposure and crosslinking of the SU-8 layer. The S1818 layer undergoes a longer softbake than is usually utilized, 110° C. for approximately 12½ min rather than the prescribed 75 s at 110° C. The reason for this longer bake is to create a more stable base for the metal layer. Once again, the softbake times and temperatures were fine-tuned to optimize material compatibility and the overall process. When a standard S1818 softbake is used, remaining solvents in the photoresist are baked off in subsequent steps following metal deposition, resulting in defects and non-uniform characteristics in the metal layer, as shown in FIG. 2(a) with an aluminum layer. It was discovered that a 12½ min S1818 softbake resulted in a more stable and uniform metal layer through subsequent bakes, as shown in FIG. 2(b), while not having a negative impact on the processing of the SU-8 layer. The sample is then allowed to rest at ambient temperature for several minutes to allow the S1818 layer to stabilize. Next, approximately 500 Å of aluminum, titanium, or gold is evaporated onto the sample to serve as a UV block for the SU-8 layer. Aluminum was initially chosen as a metal barrier layer because it blocks the 365 nm UV wavelength used to expose the sample, plus it can be deposited via e-beam evaporation at a lower power than other available metals, thus reducing the likelihood of unintentional crosslinking during the deposition process. Titanium and gold were also investigated because they also block the 365 nm UV wavelength, plus they were shown to effectively not crosslink the SU-8 layer during deposition.

Figure 3:
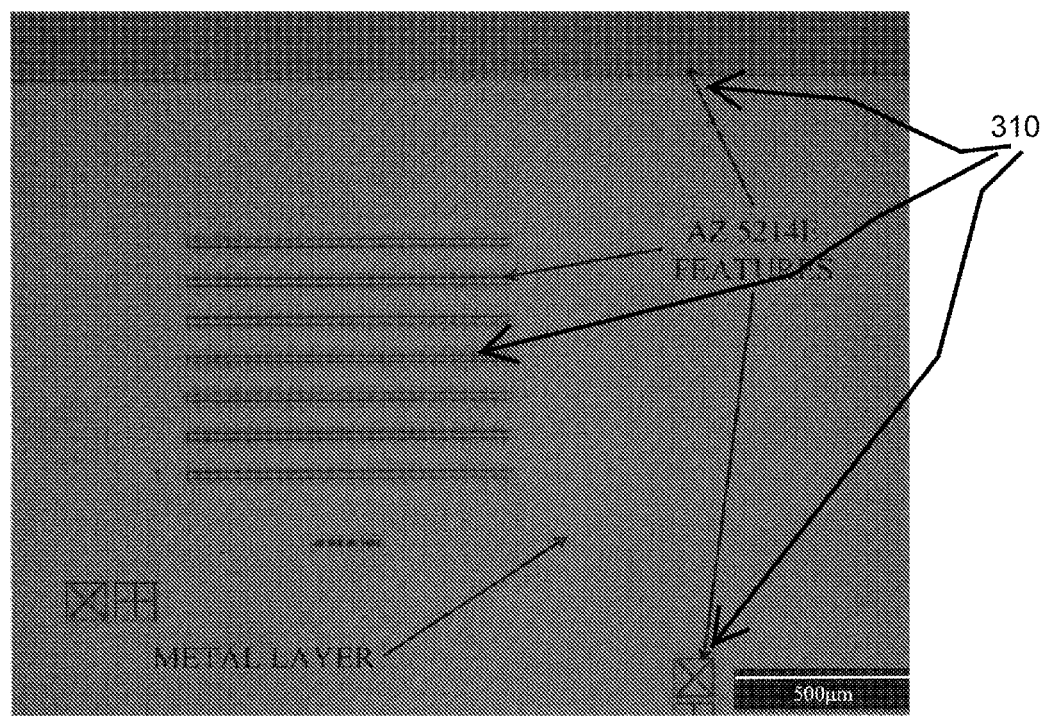
FIG. 3 is an optical image of developed AZ 5214E features on a titanium layer.
Figure 4:
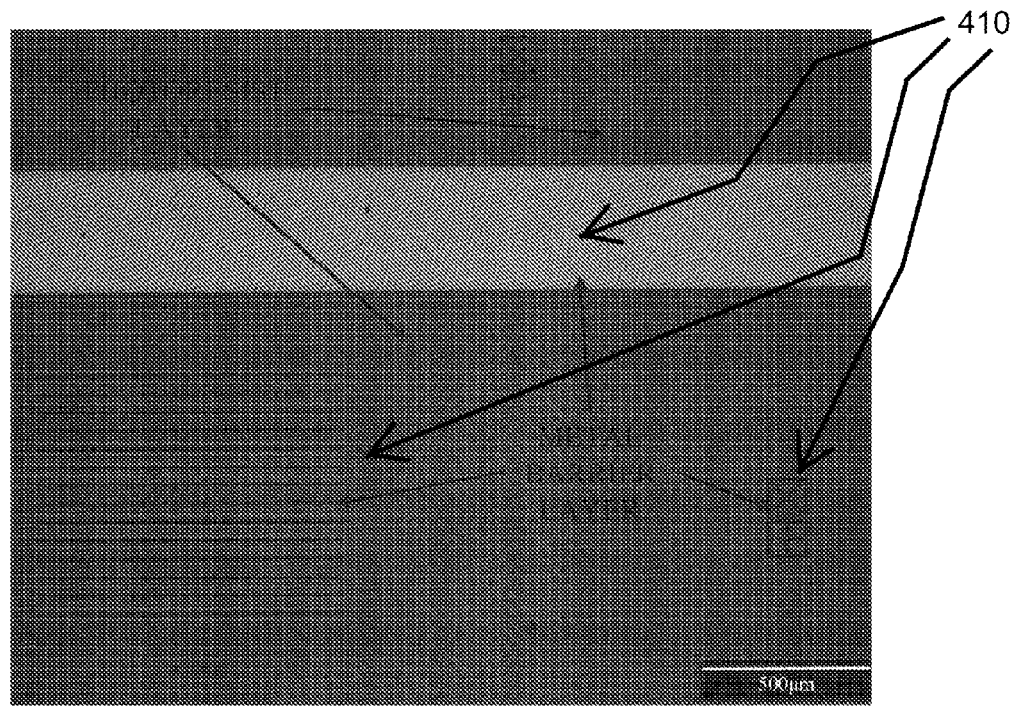
FIG. 4 is an optical image of a titanium barrier layer on a photoresist layer.
Figure 5:
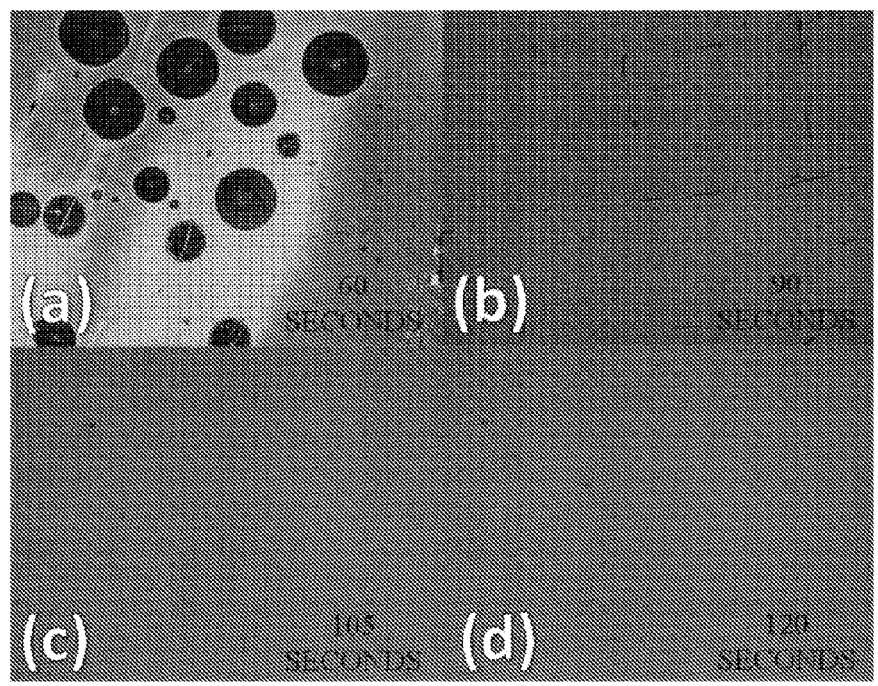
FIG. 5 is the qualitative comparison of SU-8 photoresist layer integrity based on exposure time: (a) 60 sec., (b) 90 sec., (c) 105 sec., and (d) 120 sec.

Once the sample has had adequate time to cool, it is coated with AZ 5214E at the standard spin speed for a 1.4 µm layer and baked at 110° C. for 50 s. The sample is then exposed using a positive photomask for 3 sec. at an intensity of 11 mJ/cm$^2$ using a Karl Suss MJB3 Photomask Aligner. This is followed by the most critical step for the AZ 5214E processing, a 115° C. post-exposure bake for 2 min. This post-exposure bake acts as a reversal bake, in which the image reversal characteristic of the AZ 5214E is activated. Following the reversal bake, the sample is subjected to a 14 sec. flood exposure on a Karl Suss MJB3, which affects the solubility of the AZ 5214E, as described above. The AZ 5214E layer is then developed using 351 Developer. Once the image reversal features 310 are obtained and verified in the AZ 5214E layer, as shown in FIG. 3, the metal in the open windows is etched with buffered oxide etch (BOE) for aluminum or titanium layers, and gold etchant (Transene Company, type TFA) for the gold layers. The exposed areas of photoresist (S1818 on top of SU-8) are then subjected to a 1 min. and 45 sec. exposure on the MJB3, with the remaining metal features 410 on the sample acting as a UV blocking barrier mask, as shown in FIG. 4. The 1 min. and 45 sec. exposure time was obtained through an exposure study to determine the optimum time to expose the photoresist layer, since the SU-8 is being exposed through the S1818. This was important because if the SU-8 layer is not exposed completely, and thus not fully crosslinked, it would not have the structural integrity to act as a masking layer. FIG. 5 highlights some of the results for the exposure study. As can be seen, at an exposure time of 60 sec., (a), the integrity of the layer is poor with multiple defects. At 90 sec., (b), the integrity of the layer is better, but there are still some apparent defects. At 1 min and 45 sec., (c), and 2 min., (d), the integrity of the layer is good enough to process with. There is not much difference in the integrity of the layers between 1 min and 45 sec. and 2 min., so 1 min. and 45 sec. was chosen in order to avoid any overexposure problems.

Figure 6:
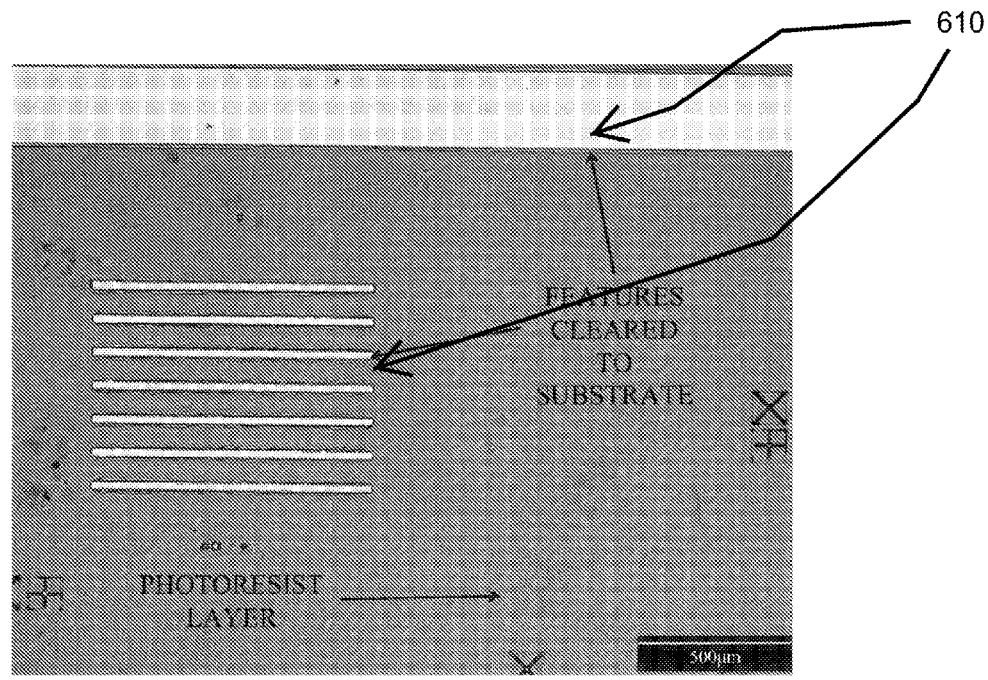
FIG. 6 is an optical image of a SU-8 masking layer fabricated using a positive photomask and a titanium barrier layer.

The exposure of the photoresist layer is followed by a ramped post-exposure bake, with a bake at 65° C. for 3 min. followed by a bake at 110° C. for 3 min. Once again, this longer bake helps ensure the integrity of the SU-8 layer as it proceeds through the process. Next, the remaining AZ 5214E is removed, as well as the remaining metal and S1818 layers. This opens up the unexposed SU-8 areas for the development step. The sample is placed in SU-8 developer and placed in an ultrasonic bath to develop out the unexposed SU-8 areas, and as a result opening up windows 610 to the substrate, as shown in FIG. 6. The exposed SU-8 areas are crosslinked, so they do not develop out, and now are able to act as a mask for the etching. Next, the sample is given a quick BOE dip to clear out any native oxides or contaminants that may have formed in the photoresist windows, and then the features are isotropically etched into the silicon substrate using a RIE tool and SF$_6$.

Figure 7:
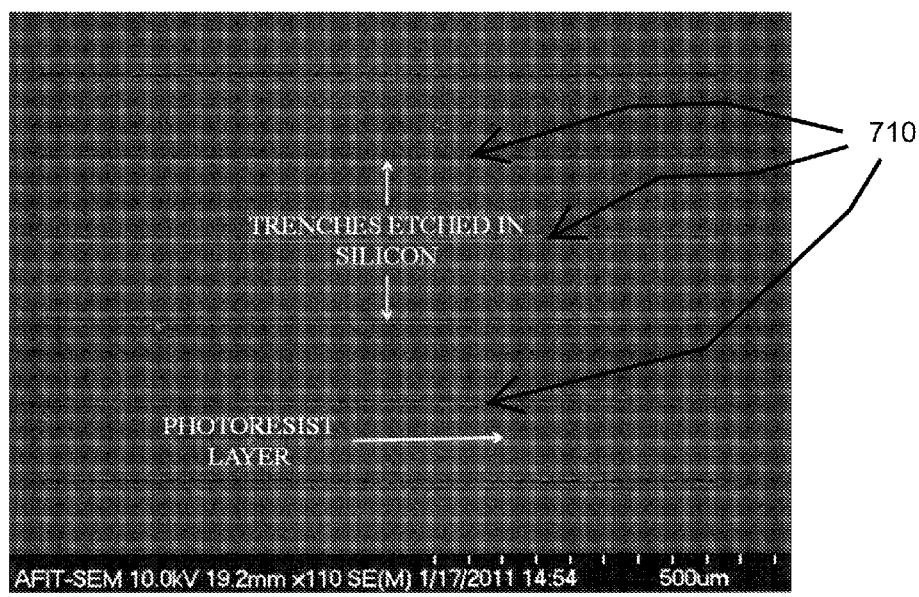
FIG. 7 is an SEM top view of features etched into the silicon substrate utilizing an SU-8 masking layer fabricated using a positive photomask and a titanium barrier layer.
Figure 8:
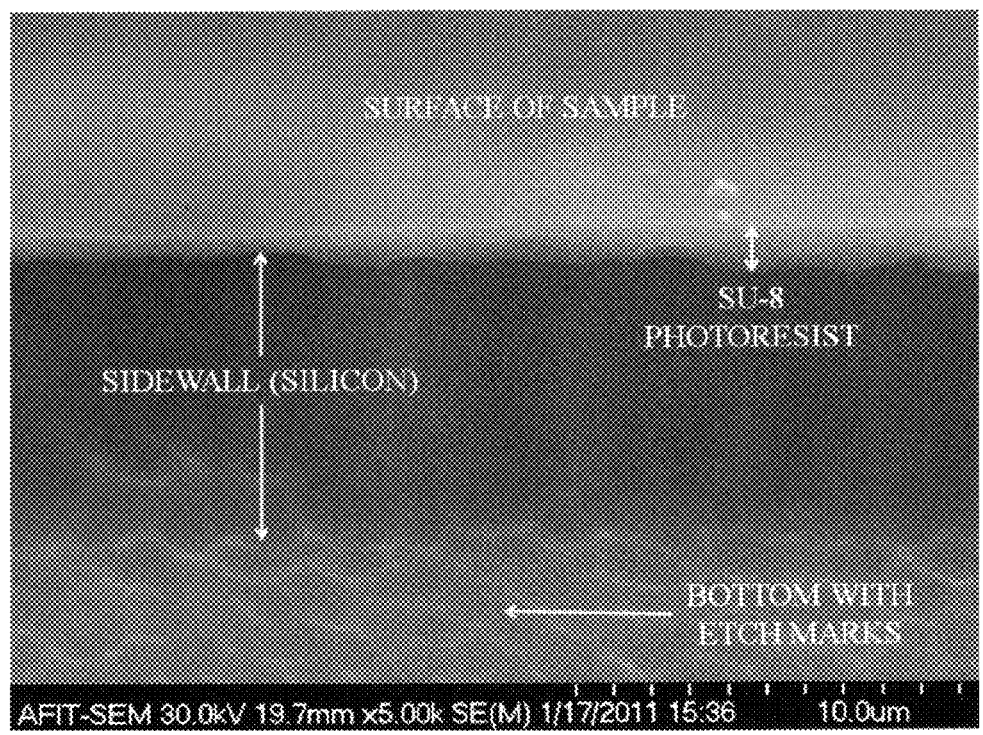
FIG. 8 is an SEM side view of a trench etched into a silicon substrate (titanium barrier layer used).
Figure 9:
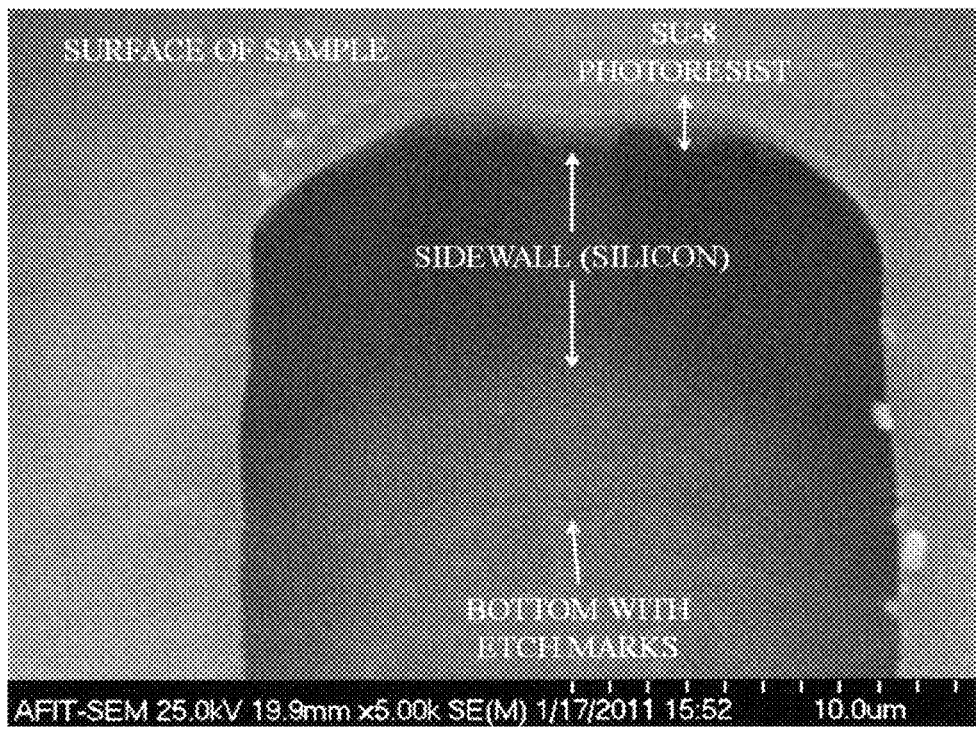
FIG. 9 is an SEM of the endcap of a trench etched into a silicon substrate (titanium barrier layer used).

FIG. 6 shows an optical image of the SU-8 masking layer created utilizing this processing technique with a titanium barrier layer. The positive photomask characteristics and features were successfully translated to the SU-8 layer. FIG. 7 shows the features obtained with this SU-8 masking layer, trenches 710 etched into a silicon substrate, thus highlighting the ability to use a combination of negative and positive photoresists with a positive mask, to create masking layers suitable for bulk micromachining silicon substrates. FIG. 8 shows an SEM side view of a trench in the silicon substrate, and FIG. 9 shows an end view of the trench. The SU-8 layer step height was measured at approximately 5 µm prior to etching. After etching for 60 min, the total step height was measured at approximately 9.2 µm, resulting in an approximate etch depth into the silicon of 8.2 µm.

While the final process may appear straightforward using hindsight, working through the process development showcased some critical areas that need to be considered when working with this combination of materials, mostly with how these materials interact with unexposed SU-8. The temperature at which SU-8 was baked, and the temperatures it was subjected to during processing, were important aspects in developing this process. To begin with, when SU-8 was baked at the prescribed times and temperatures, adhesion issues and cracking were observed during the SU-8 post-exposure bakes. A typical solution to these types of issues is a longer post-exposure bake, but since these issues appeared during the 65° C. softbake step, a longer post-exposure bake alone was not a viable option. Through further investigation, it was discovered that extending the softbake and the post-exposure bake times to the steps described above resulted in a consistent and viable SU-8 layer. Another critical area was ensuring that the SU-8 was not inadvertently exposed and crosslinked prematurely. Initially, plans were to use a metal layer directly on top of the unexposed SU-8 as a UV block, therefore only requiring three layers—SU-8, metal, and AZ 5214E. Attempts at sputtering and evaporating various metals directly onto the SU-8 resulted in crosslinking. The sputtering and evaporating processes, through the creation of plasma in the case of sputtering and radiation/heat transfer in the case of evaporation, created enough UV energy to expose and inadvertently crosslink the SU-8.

Figure 10:
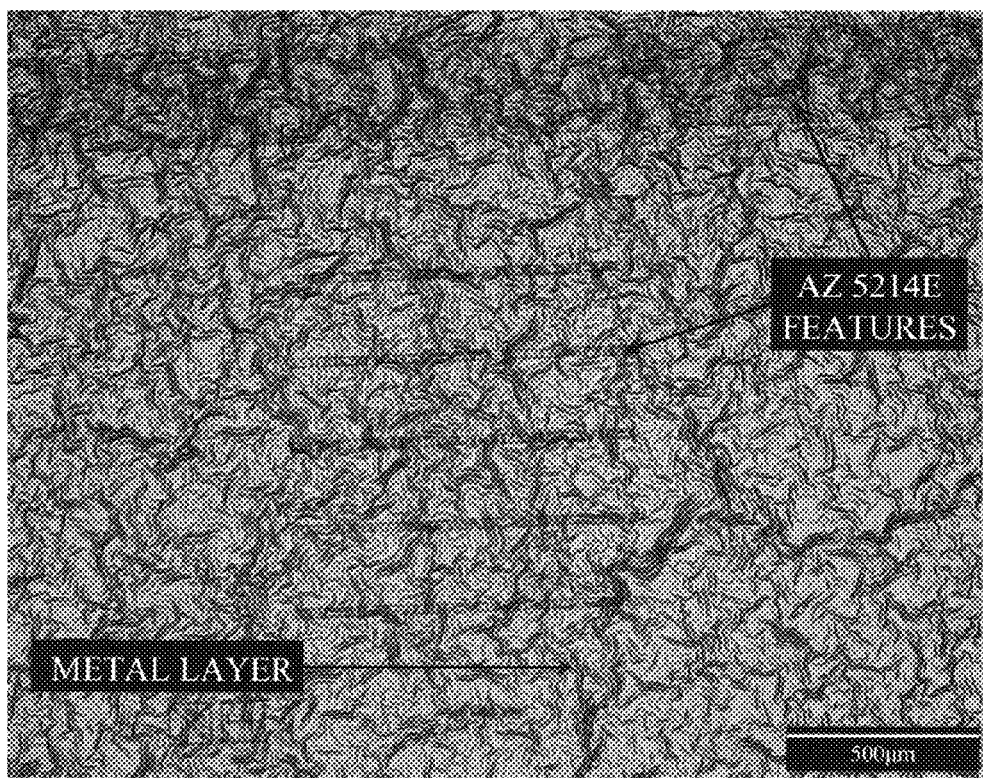
FIG. 10 is an optical image of developed AZ 5214E features on an uneven aluminum layer.
Figure 11:
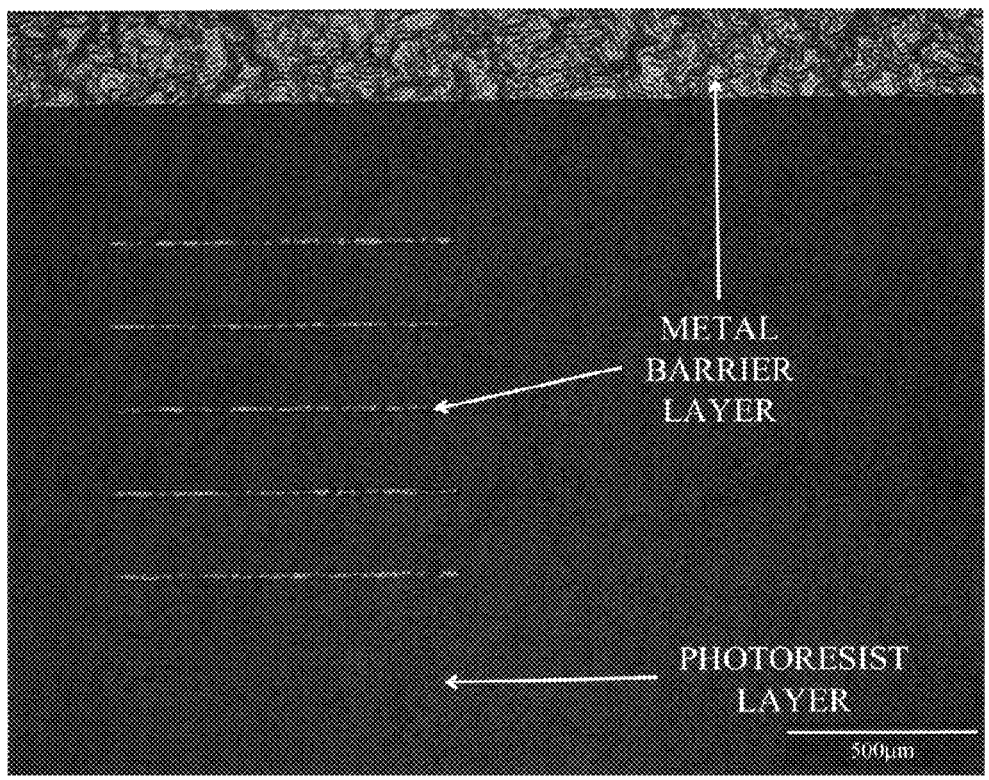
FIG. 11 is an optical image of an aluminum barrier layer on a photoresist layer (both uneven).
Figure 12:
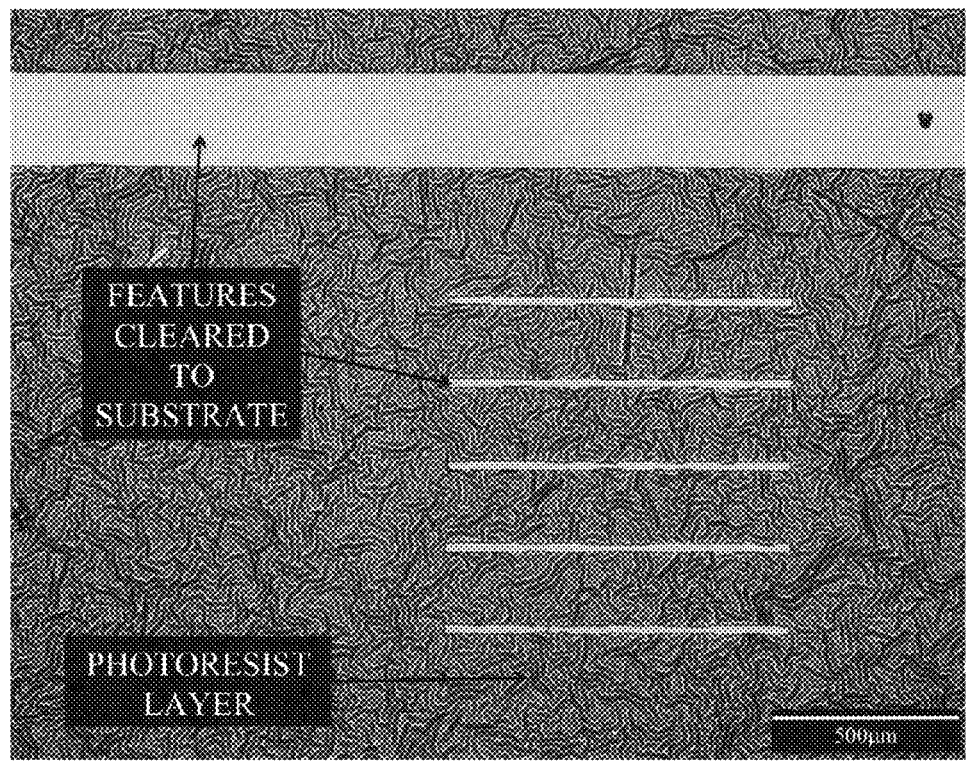
FIG. 12 is an optical image of an uneven SU-8 masking layer fabricated using a positive photomask and aluminum barrier layer.
Figure 13:
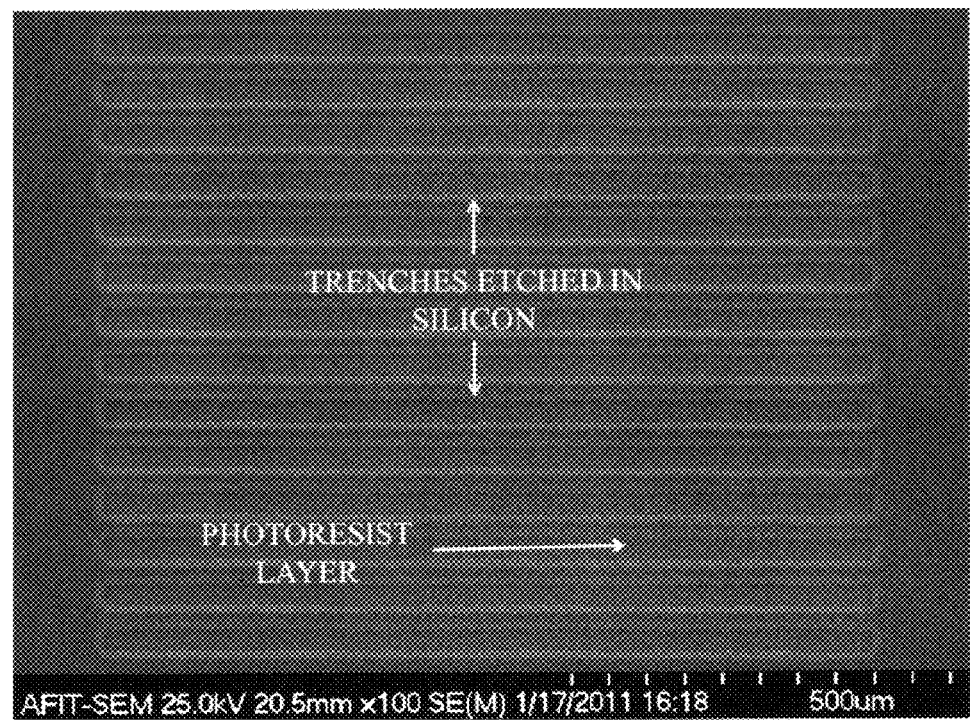
FIG. 13 is an SEM of features etched into the silicon substrate utilizing an uneven SU-8 masking layer fabricated using a positive photomask and aluminum barrier layer.
Figure 14:
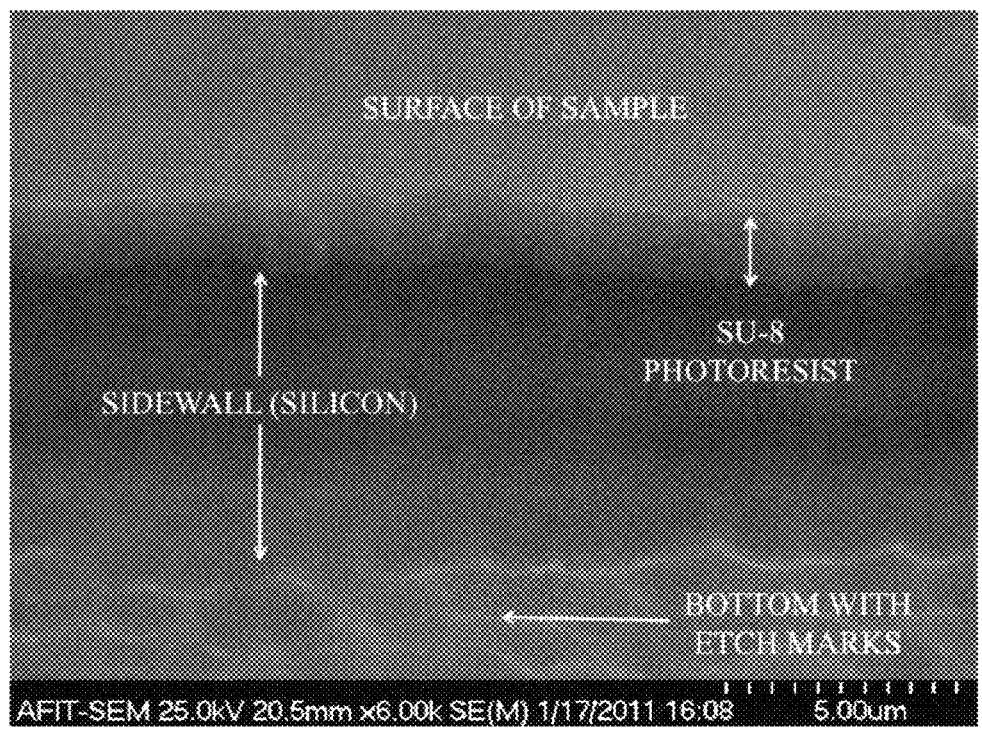
FIG. 14 is an SEM side view of a trench etched into a silicon substrate (Al barrier layer used).
Figure 15:
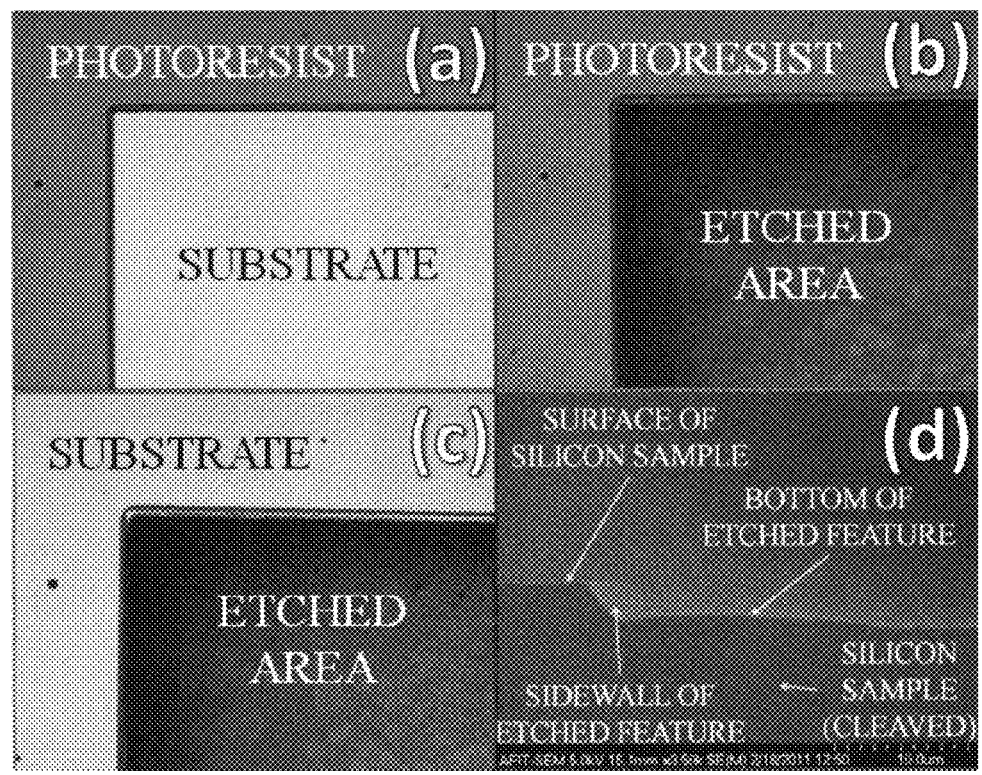
FIG. 15 is optical images and SEM of an S1818 release layer for SU-8: (a) developed features in SU-8; (b) features etched into the silicon substrate; (c) SU-8 removed from sample; (d) profile of etched features in silicon.

Initial attempts at depositing various protective layers on top of the unexposed SU-8 before depositing the metal layer were not successful. Eventually, it was discovered that exposing both the S1818 and SU-8 layers at the same time, followed by the SU-8 post-exposure bake, allowed the SU-8 layer to be developed out and processed as intended. Furthermore, when applying the S1818 on top of the SU-8, the spin speed of the S1818 was important. When the S1818 was spun at a speed greater than what the SU-8 was spun at, the S1818 tends to diffuse into the SU-8, resulting in erratic thicknesses. When the S1818 was spun at a speed less than what the SU-8 was spun at, this issue was overcome and film thickness was as expected. There is most likely, however, still some material diffusion at the interface of the two photoresists but it does not negatively affect using the SU-8 and S1818 in this process. Therefore, an S1818 layer on top of the SU-8 provided adequate protection to allow for the evaporation of a UV barrier metal without exposing and prematurely crosslinking the SU-8 layer below. A longer S1818 softbake to maximize solvent release and create a more stable base for the metal barrier layer is crucial. A 12½ min bake time was found to be a sufficient bake time provided the samples were not unnecessarily left exposed to ambient conditions. FIG. 10 shows the AZ 5214E developed on top of an aluminum layer after being inadvertently exposed and not processed for approximately 2 days. As can be seen, the aluminum layer develops "hills and valleys," which translates to poor features in the AZ 5214E. This unevenness is seen through the rest of the process, such as the aluminum mask as shown in FIG. 11 and the SU-8 masking layer as shown in FIG. 12. This unevenness results in lower resolution features when compared to those that were processed without delays. This is highlighted in FIG. 13, which shows trenches 1310 etched into a silicon substrate, and FIG. 14, which shows a side view of a trench. Even though features were realized with the processing technique utilizing this sample, the results are less than desirable. In general, samples that are processed the same day provided the best results. The current processing technique results in a robust SU-8 layer remaining after etching, which in some applications is not desirable. In order to address this, a quick investigation into using S1818 as an SU-8 release layer was initiated, and the initial results look promising. In this initial investigation, S1818 was spun onto a silicon substrate, followed by an extended bake of 12½ min at 110° C. The extended bake was utilized to provide a solid base for the SU-8 layer that is spun on top of the S1818. After the SU-8 was spun on, the sample was exposed for 10 s, and then developed out as shown in FIG. 15(a). The features were then etched into the substrate using an RIE, as shown in FIG. 15(b). This was followed by placing the sample in acetone and placing it in an ultrasonic bath. In less than 2 min, the S1818 dissolved and the SU-8 layer floated off of the substrate leaving behind a sample with bulk micromachined features without an SU-8 masking layer, as shown in FIGS. 15(c) and 15(d). In FIG. 15(d), the sample was cleaved in order to provide a profile of the etched features.

Having thus described exemplary embodiments of the present invention, it should be noted by those skilled in the art that the disclosures herein are exemplary only and that alternatives, adaptations and modifications may be made within the scope of the present invention.

What is claimed is:

1. A process for fabricating features into a wafer using a combination of negative and positive photoresists for use with positive photomasks, resulting in masking layers suitable for bulk micromachining in the fabrication of microelectromechanical systems (MEMS); comprising the steps of:
    (a) spinning a negative photoresist onto the wafer;
    (b) spinning a positive photoresist buffer layer onto the negative photoresist;
    (c) depositing a barrier layer onto the positive photoresist buffer layer;
    (d) spinning on an image reversal photoresist layer onto the barrier layer;
    (e) exposing the image reversal photoresist layer with a positive mask;
    (f) performing a post exposure bake;
    (g) flood exposing the image reversal photoresist layer;
    (h) developing away unexposed areas of the image reversal photoresist, creating windows in the image reversal photoresist to the barrier layer;
    (i) etching away the barrier layer through the windows;
    (j) flood exposing the positive photoresist buffer layer and the negative photoresist;
    (k) post exposure baking the negative photoresist;
    (l) removing remaining image reversal photoresist, barrier layer, and positive photoresist;
    (m) developing away unexposed areas of the negative photoresist to form features in the negative photoresist; and,
    (n) etching the features into the substrate.

2. The process of claim 1 wherein said negative photoresist of step (a) is SU-8.

3. The process of claim 2 wherein said positive photoresist buffer layer of step (b) is S1818.

4. The process of claim 3 wherein said image reversal photoresist layer of step (d) is AZ5214E.

5. The process of claim 1 wherein said buffer layer of step (b) is the positive photoresist S1818.

6. The process of claim 1 wherein said image reversal photoresist layer of step (d) is AZ5214E.

7. The process of claim 1 wherein a longer bake time and higher bake temperature of the negative photoresist in step (a) is done in order to optimize material compatibility throughout subsequent processing.

8. The process of claim 7 wherein the bake time in step (a) is 3 minutes at a temperature of 65° C. followed by a bake at 110° C. for 10 min.

9. The process of claim 1 wherein a longer bake time of the buffer layer in step (b) is done in order to optimize material compatibility throughout subsequent processing.

10. The process of claim 9 wherein the bake time in step (b) is about 12½ minutes at a temperature of 110° C.

11. The process of claim 1, in which the image reversal photoresist is utilized to create a UV barrier mask from the barrier layer for subsequent processing.

12. The process of claim 1 wherein the exposure time for the stack of the negative photoresist and the positive photoresist buffer layer in step (j) is long enough to ensure that the negative photoresist is exposed sufficiently to fully crosslink, and therefore have sufficient structural integrity to act as a masking layer.

13. The process of claim 12 wherein the exposure time in step (j) is about 1¾ minutes, with the remaining layers on the wafer acting as a UV blocking barrier mask.

14. The process of claim 1 wherein a mask of complementary features is created out of the negative photoresist of step (m) suitable to stand up to aggressive etch chemistries.

15. The process of claim 1, further including an additional processing step for removaling the negative photoresist layer following its use as a mask in step (n).

16. The process of claim 15, further including a release layer that allows the negative photoresist masking material, which is left in place after processing, to be removed after etching the substrate.

17. The process of claim 16 wherein the release layer is deposited before the negative photoresist in step (a), and is removed along with the negative photoresist layer after step (n).

18. The process of claim 17, wherein the release layer is the positive photoresist S1818.

* * * * *